United States Patent
Balogh et al.

(10) Patent No.: US 7,329,014 B2
(45) Date of Patent: Feb. 12, 2008

(54) COLLECTOR MIRROR FOR PLASMA-BASED, SHORT-WAVELENGTH RADIATION SOURCES

(75) Inventors: Istvan Balogh, Jena (DE); Kai Gaebel, Jena (DE)

(73) Assignee: XTREME Technologies GmbH, Jena (DE)

( * ) Notice: Subject to any disclaimer, the term of this patent is extended or adjusted under 35 U.S.C. 154(b) by 102 days.

(21) Appl. No.: 11/402,391

(22) Filed: Apr. 11, 2006

(65) Prior Publication Data

US 2006/0227826 A1  Oct. 12, 2006

(30) Foreign Application Priority Data

Apr. 12, 2005  (DE) .................. 10 2005 017 262

(51) Int. Cl.
G02B 5/08  (2006.01)
(52) U.S. Cl. .................................... 359/845
(58) Field of Classification Search ............... 359/845, 359/846, 869, 727; 355/53, 52; 126/602, 126/605

See application file for complete search history.

(56) References Cited

U.S. PATENT DOCUMENTS 6,655,808 B2 * 12/2003 Antoni et al. ............... 359/846

2004/0227920 A1  11/2004 Hara

FOREIGN PATENT DOCUMENTS

| DE | 100 50 125 | 4/2002 |
| DE | 101 02 969 | 7/2002 |
| EP | 1 376 185 | 1/2004 |
| WO | WO 2004/003982 | 1/2004 |

* cited by examiner

*Primary Examiner*—Euncha P. Cherry
(74) *Attorney, Agent, or Firm*—Reed Smith LLP

(57) ABSTRACT

The invention is directed to a collector mirror for short-wavelength radiation based on a plasma. It is the object of the invention to find a novel possibility for managing the temperature of a collector mirror for focusing short-wavelength radiation generated from a plasma which allows an efficient thermal connection to be produced between the optically active mirror surface and a thermostat system without the disadvantages relating to space requirements or high-precision manufacture of the collector mirror. This object is met, according to the invention, in that the collector mirror has a solid, rotationally symmetric substrate which comprises a material with high thermal conductivity of more than 50 W/mK and in which channels for cooling and temperature management are incorporated in the substrate so that a heat transport medium can flow through directly and for rapidly stabilizing the temperature of the optically active mirror surface. Heat of transient temperature spikes which occur in pulsed operation for plasma generation at the mirror surface and which temporarily exceed the temperature average by a multiple is quickly dissipated.

25 Claims, 4 Drawing Sheets

COLLECTOR MIRROR FOR PLASMA-BASED, SHORT-WAVELENGTH RADIATION SOURCES

CROSS-REFERENCE TO RELATED APPLICATION

This application claims priority of German Application No. 10 2005 017 262.8, filed Apr. 12, 2005, the complete disclosure of which is hereby incorporated by reference.

BACKGROUND OF THE INVENTION a) Field of the Invention

The invention is directed to a collector mirror for short-wavelength radiation sources based on a plasma having an optically active mirror surface with high reflectivity for the desired short-wavelength radiation and in which means for cooling the mirror body are provided due to the position of the collector mirror in the immediate vicinity of the plasma which has an extremely high temperature. The invention is preferably applied in radiation sources for large-scale production in semiconductor lithography which emit in the extreme ultraviolet spectral region (EUV region).

b) Description of the Related Art

Plasma-based radiation sources for semiconductor lithography (primarily EUV sources) are essentially thermal radiators which emit their output in a solid angle of $4\pi$ sr. The emission is generally not isotropic. The excitation process which can be carried out either by gas discharge (GDPP sources) or by a laser beam (LPP sources) has a low-percentage efficiency in a 2-percent narrow EUV spectrum with a central wavelength between 12.4 nm and 14 nm that is usable for the application. On the other hand, the conversion of the excitation output into a broadband extreme ultraviolet spectrum has an efficiency of several tens percent. The EUV radiation in the range of 1 nm to 100 nm has a large cross section of interaction with material, i.e., this radiation is completely absorbed already over very small path lengths. To compute orders of magnitude, it can be assumed that essentially the entire excitation output of plasma-based radiation sources reaches components of the radiation source through radiation transport and occurs at these components as thermal output.

The collector mirror collects a significant proportion of the radiation of the source (plasma) exiting in the solid angle of $4\pi$ sr and projects the radiation in the application band range (wavelength range around 13.5 nm) in an intermediate focus. While glass is suitable in principle for producing collector mirrors for plasma-based radiation sources because it can be produced with excellent surface quality, its thermal conductivity ($\approx 1$ W/mK) is too small to use it as a substrate of a collector mirror in an EUV source for semiconductor lithography.

In particular for alternating-layer mirrors with direct (non-grazing) radiation reflection, dissipation of this radiation load and thermal load constitutes a technical challenge because the temperature average of the alternating-layer mirror may not exceed several tens of degrees Centigrade. A degradation in the alternating-layer system takes place even when the mirror is heated (only temporarily) to above approximately 200° C. and leads to a substantial reduction in reflectivity. Transient temperature curves with temporary temperature spikes appreciably above the temporal temperature average of the reflection coating occur due to the pulsed operation of the plasma-based sources.

According to the prior art, collector mirrors are fabricated from substrates, e.g., silicon, having a thermal conductivity appreciably higher than that of glass, and the substrate—as is shown in FIG. 3—is pressed on a heatsink or cooling body. Contact foils, e.g., comprising indium, are often used for this purpose. At the outputs of an EUV source for large-scale production in semiconductor lithography at which several tens of kW excitation output are converted, cooling of this kind is not sufficient for ensuring a long lifetime of the reflection coating of the collector mirror.

OBJECT AND SUMMARY OF THE INVENTION

It is the primary object of the invention to find a novel possibility for managing the temperature of a collector mirror for focusing short-wavelength radiation generated from a plasma which allows a high-performance thermal connection to be produced between the optically active mirror surface and a thermostat system without the disadvantages relating to space requirements or requirements for the high-precision manufacture of the collector mirror. Further, processes for the additional or subsequent surface coating of the collector mirror are also possible without greater expenditure.

According to the invention, this object is met in a collector mirror for short-wavelength radiation sources based on a plasma which has an optically active mirror surface with high reflectivity for the desired short-wavelength radiation and in which means are provided for managing the temperature of the mirror body because of the position of the collector mirror in the immediate vicinity of the hot plasma, wherein the collector mirror has a solid, rotationally symmetric substrate which comprises a material with high thermal conductivity of more than 100 W/mK, and in that flow channels for cooling and temperature management are incorporated directly in the substrate so that a heat transport medium can flow through directly for rapidly stabilizing the temperature of the optically active mirror surface at a defined level, wherein heat from transient temperature spikes which occur in pulsed operation for plasma generation and which temporarily exceed the temperature average prevailing at the mirror surface by a multiple is quickly dissipated.

The channels of the heat transport medium are advantageously arranged close to the optically active mirror surface and have at least predominantly a radial flow direction within the substrate. The channels are preferably arranged so as to be uniformly distributed in radial direction to the optical axis of the collector mirror. Connections for supplying and discharging the heat transport medium are provided in the center and at the periphery of the substrate. The channels can be arranged orthogonal to the axis of symmetry of the substrate. However, they are advisably arranged parallel to a middle tangent at the generating curve of the optically active mirror surface and, therefore, along an outer surface of a cone.

The channels for the heat transport medium are preferably in the form of cylindrical bore holes, and the connections for the supply of heat transport medium can advantageously be screwed into threaded bore holes in the substrate in a simple manner.

In another constructional variant, the channels are introduced in the substrate in the form of finely structured channels for a substantially radial flow of the heat transport medium from the back of the collector mirror, and they extend up to the optically active mirror surface at a constant distance of a few millimeters. The channels are advisably constructed in a plurality of curved structures which are arranged so as to be uniformly distributed around the axis of symmetry of the substrate.

Further, it has proven advantageous when the substrate is constructed in two parts. The first part, as substrate, has the optically active mirror surface and the finely structured channels incorporated on the back, and the second part, as cover, is designed to cover the channels so as to be tight against media.

In order to connect the substrate and cover in such a way that the channels are sealed off, machining is advisably carried out such that the two surfaces lie one on top of the other in a positive engagement and are locked in a frictional engagement. A structured seal can be provided between the two parts for connecting the substrate and cover in such a way that the channels are sealed.

The cover of the two-part substrate is preferably pressed against the substrate by screws through a plurality of threaded bore holes in the substrate. However, it can also advisably be pressed against the substrate by means of clamps arranged at the periphery.

Another possibility for fastening the cover is a material bond with the substrate which can advantageously be achieved by means of a solder connection or by cementing or gluing.

With non-grazing incidence of the desired radiation on the collector mirror at large angles, the substrate is fashioned in aspherical shape from a material with a thermal conductivity of more than 100 W/mK and the optically active mirror surface is provided with a reflection coating which has a reflectivity of more than 40% in the wavelength region around 13.5 nm.

The substrate is preferably made of silicon and the reflection coating is made as an alternating-layer system including silicon. The alternating-layer system is advisably formed of alternating-layers of Si and molybdenum, but is not limited to this layer construction.

With grazing incidence of the desired radiation on the collector mirror, the substrate is advisably made from a metal with a thermal conductivity of more than 100 W/mK (e.g., molybdenum, tungsten, copper, etc.) and a directly integrated optically active mirror surface having a reflectivity of greater than 50% with grazing radiation incidence in the wavelength range around 13.5 nm.

In another advantageous construction for grazing radiation incidence, the substrate is made from a metal with a thermal conductivity of more than 100 W/mK and the optically active mirror surface is provided with an additional reflection coating, e.g., of palladium, which has a reflectivity of greater than 50% with grazing radiation incidence in the wavelength range of 13.5 nm.

In both cases, it is advantageous that the substrate is provided with a surface-coating layer at the optically active mirror surface.

The invention is based on the fundamental idea that the lifetime of a collector mirror, particularly when using a highly-reflective alternating-layer system, is considerably shortened already when heated to above approximately 200° C. through degradation of the reflective coating which results in reduced reflectivity. Due to the pulsed operation of the plasma-based EUV sources, transient temperature curves occur which have temporary temperature spikes that are appreciably higher than the temporal average. In order to compensate for these temporary temperature spikes as quickly as possible, the usual external thermostat coupling is omitted and the heat transfer (temperature management) is integrated directly in the mirror substrate by incorporating suitable flow channels for a heat transport medium in the substrate. On the one hand, the flow channels must be introduced in a suitable manner so that the conventional machining steps for mirror fabrication such as grinding, polishing and vapor deposition of aspheric reflection surfaces are not made more laborious or impossible. On the other hand, the connections of the thermostat circuit for supplying the heat transport medium must also be carried out in a simple manner so as to be functional under vacuum. This is preferably carried out by means of screws in the center (or the part of the collector closest to its axis) and at the periphery of the rotationally symmetric mirror substrate. Long heat-conducting paths from the optical reflection layer to the heat transport medium and heat transmission barriers to an externally contacting heat exchanger (cooling body) are avoided by means of this direct temperature management, according to the invention, which is essentially carried out radially from the outside to the inside.

With the solution according to the invention it is possible to realize a reliable cooling and temperature management of a collector mirror for focusing short-wavelength radiation generated from a plasma which allows an efficient thermal connection to be made between the optically active mirror surface and a thermostat system without having to tolerate disadvantages with respect to space requirement or requirements for high-precision manufacture of the collector mirror. Further, processes for the additional or subsequent surface coating of the collector mirror are also made possible without increasing expenditure.

The invention will be described more fully in the following with reference to embodiment examples.

DESCRIPTION OF THE PREFERRED EMBODIMENTS

Figure 3:
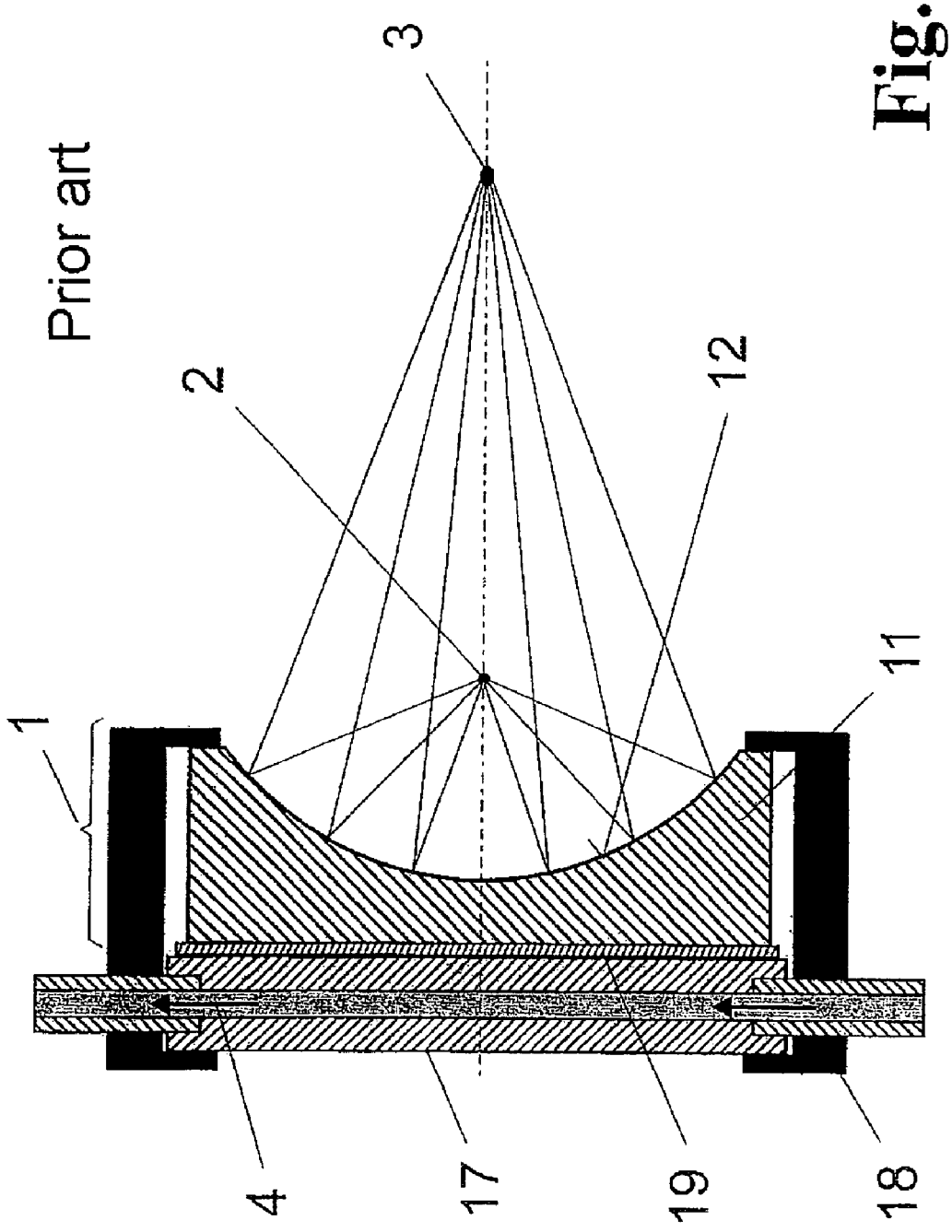
FIG. 3 shows the prior art for holding and cooling a collector mirror in which the mirror is pressed against a cooling body by a foil with good thermal conductivity and wherein a coolant flows through the cooling body.

The task of collecting the radiation required for the lithographic process from a large solid angle around the source location (plasma 2) and projecting it into an intermediate focus 3, as it is called, is accomplished generally and in a conventional manner by a collector mirror 1 in a plasma-based short-wavelength radiation source which emits intensive radiation, for example, in the EUV range around 13.5 nm. This arrangement is illustrated in FIG. 3 and shows the conventional cooling of the collector mirror 1, according to the prior art, with a cooling body 17 which is intended to protect the reflection layer 12 applied to the optically active surface against overheating. In this connection, large-area planar surfaces of the cooling body 17 and substrate 11 (at the back of the collector mirror 1) are pressed against one another in a frictional engagement by means of a holder 18. The heat transmission between the two parts is routinely reinforced by a heat-conducting layer 19, usually a heat-conducting foil (e.g., of indium) or a heat-conducting paste. The cooling body 17 is usually incorporated in a cooling circuit (not shown) and a heat transport medium 4 flows through it.

Figure 1:
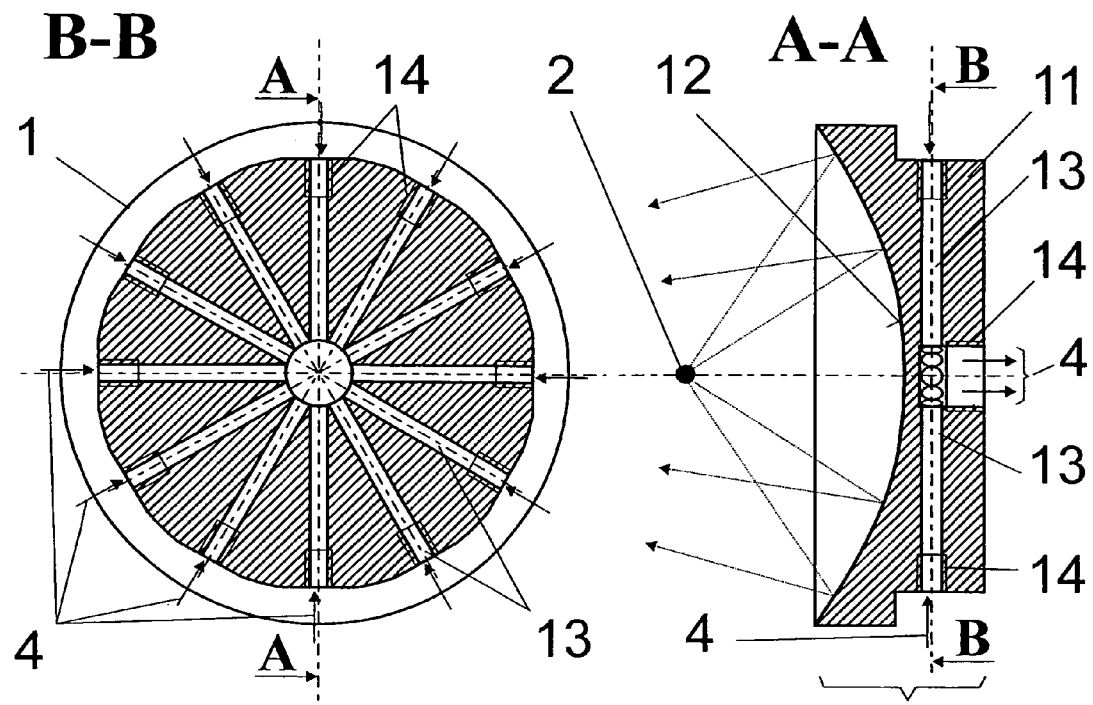
FIG. 1 is a schematic view of the collector mirror according to the invention (top view in section and side view in section) with flow channels for the integrated direct temperature management, wherein the collector mirror is located in the immediate vicinity of a plasma which is generated in a vacuum chamber (not shown) from a supplied target by means of a pulsed laser.

According to the invention—without limiting generality—for an EUV source based on a laser plasma (LPP source) as is indicated in FIG. 1 (without a detailed illustration of the laser excitation of a target), the preferred mirror design is a rotationally symmetric alternating-layer mirror (multi-layer mirror). The plasma 2, as source location, and the intermediate focus 3 are located along the axis of symmetry of the alternating-layer mirror. The wavelength-adapted reflection coating 12 of the collector mirror 1 is applied to the substrate 11 on a suitably shaped optically active surface and is preferably formed by alternating-layers of molybdenum and silicon having a thickness of several nanometers. However, the reflection coating 12 is not limited to an alternating-layer design of this kind. Further, other highly-reflective layer systems can also be used as a reflection coating 12 on the optically active surface of the substrate 11.

With its reflection coating 12 conforming to the optically active surface, the collector mirror 1 collects a significant proportion of the radiation of the plasma 2 exiting in the solid angle of $4\pi$ sr, which plasma 2, as a laser-produced plasma (LPP), is to be generated through the interaction of a laser with a target flow (neither is shown), and projects chiefly radiation in the band range (wavelength range around 13.5) applicable for semiconductor lithography in the intermediate focus 3.

In order to apply an alternating-layer system as a high-quality reflection coating 12 (with a high reflectivity of >40% for the in-band radiation in the wavelength range around 13.5 nm emitted from the plasma 2), an optical substrate 11 is required which can be machined with high precision to form an aspheric (because of the large opening angle of the EUV source) surface structure. With the currently available technologies, the required surface quality on metal aspheres cannot be achieved at reasonable prices or not without additional application of surface-coating substances.

As is further shown in FIG. 1, channels 13 are incorporated in the substrate 11 which is preferably made of silicon (with a thermal conductivity of ≈150 W/mK). The channels 13 are substantially oriented radially from the mirror periphery to the center. Threaded bore holes 14 are arranged in the channels 13 at the periphery so that the supply lines for the heat transport medium 4 from a thermostat circuit (not shown) can be screwed in in a simple manner. This connection technique is carried out in the center likewise in a (larger) threaded bore hole 14. By means of the threaded bore holes 14 which are incorporated in the substrate 11 at the inlets and outlets of the channels 13, the supply lines for the heat transport medium 4 are screwed directly to the substrate 11. In this way, critical contamination sources which can occur, for example, through outgassing from glued connections or heat-conducting pastes are prevented under typical vacuum conditions for EUV sources in spite of the line couplings of the thermostat circuit being easily detachable.

The substrate temperature management shown in FIG. 1 is especially efficient because the heat transport medium 4 is guided directly through the substrate 11, thereby avoiding heat transmission to a separate cooling body 17 (as in the prior art according to FIG. 3). A substrate 11 comprising silicon makes it possible to work out an optically active surface of the substrate with the necessary quality for precision optics. The channels 13 which are introduced in the substrate 11, according to the invention, as radially oriented bore holes and through which the heat transport medium 4 is conducted into a central bore hole 14 do not represent an impediment to the usual grinding, polishing and coating processes. On the other hand, the substrate 11 is enlarged to a barely noticeable extent by "building in" the thermostat system (through the introduction of channels 13) and all of the required machining steps for the optical shaping and coating processes and for the application of an alternating-layer system (as reflection coating 12) can be carried out exactly as in the conventional multi-layer mirror.

Figure 2:
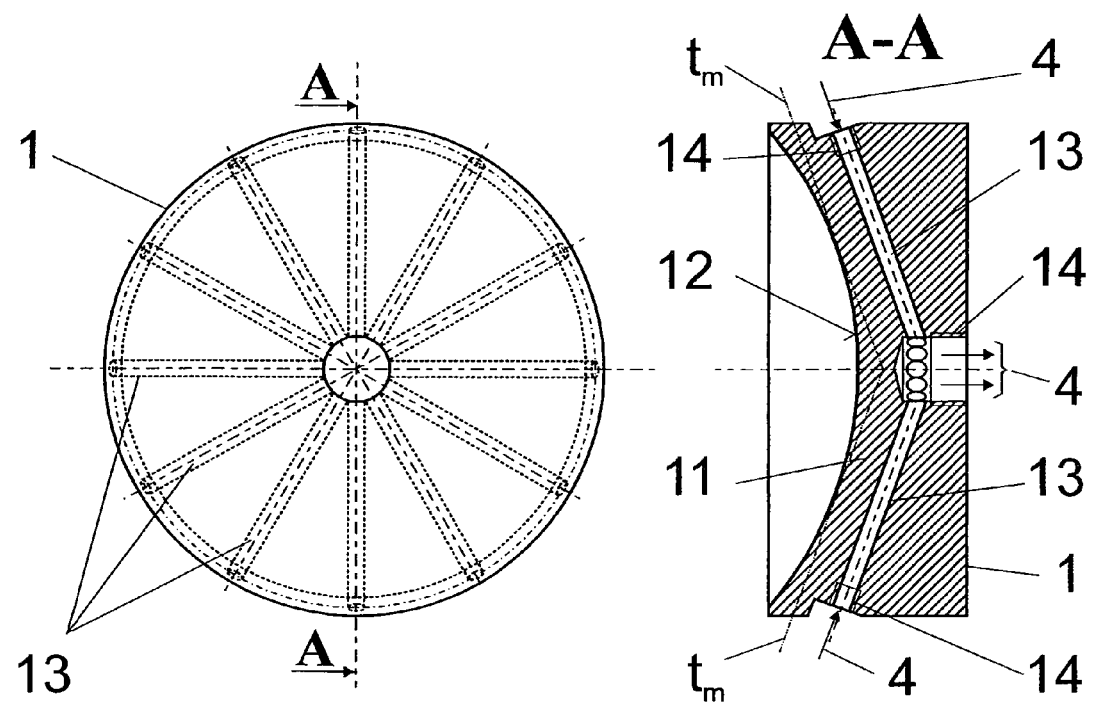
FIG. 2 is a schematic view of a collector mirror (in a top view and in a side view in section) with flow channels which extend virtually parallel to the optically active surface.

In another preferable realization, shown in FIG. 2, the channels 13 are arranged virtually parallel to the optically active surface which has a reflection coating 12. This embodiment example illustrates the possible influence of radial temperature gradients in the reflection coating 12 which is achieved by channels 13 close to the surface. When using external cooling bodies 17 (according to the prior art as shown in FIG. 3), this possibility is appreciably limited due to the heat transport paths within the substrate 11 which increase radially outward.

The channels 13 which are preferably introduced in the substrate 11 again as cylindrical bore holes extend along a conical outside surface formed by the rotation of a parallel to a middle tangent $t_m$ at the mathematically generating curve of the optically active surface.

Figure 4:
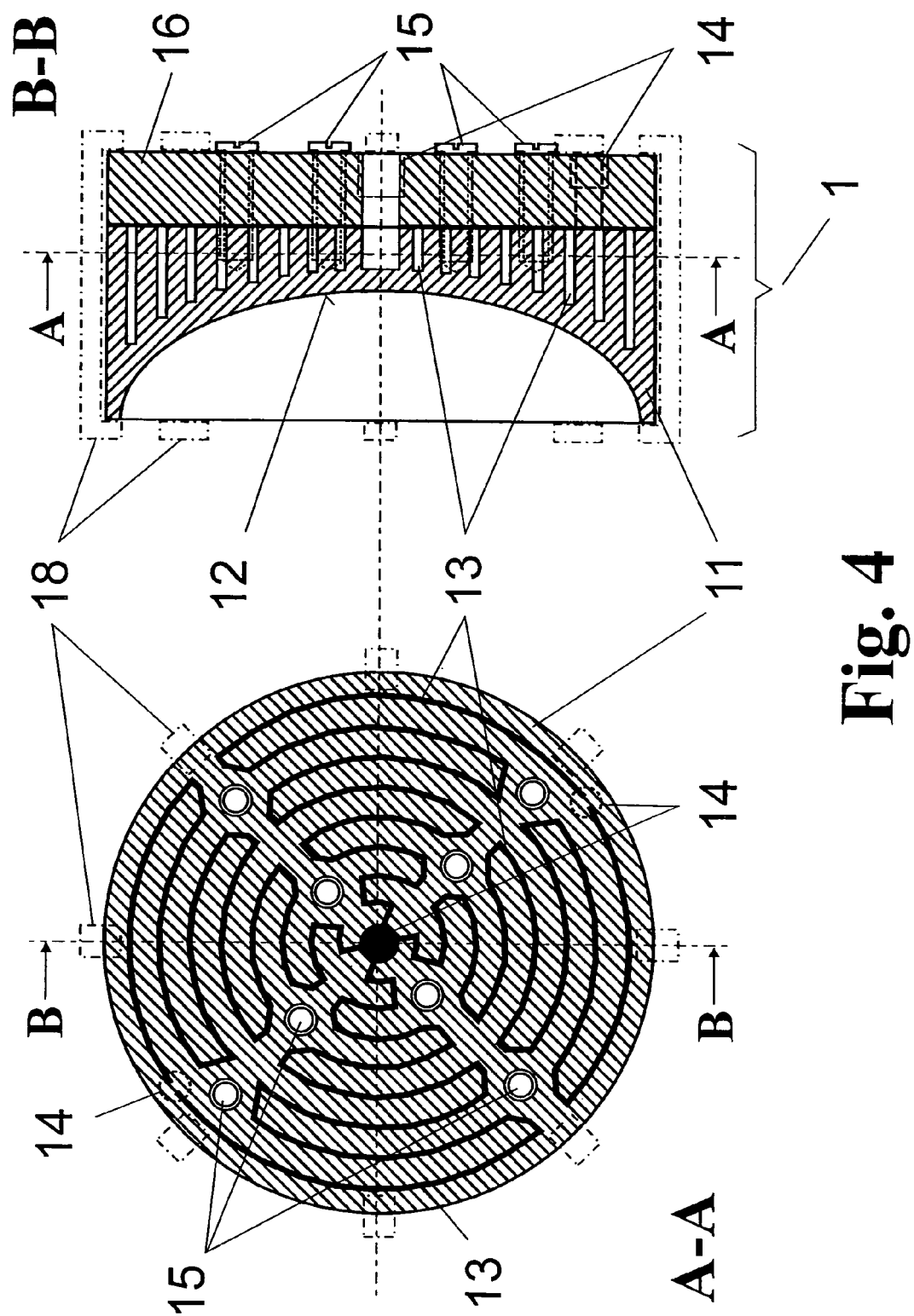
FIG. 4 is a schematic view of finely structured flow channels in the substrate which extend to within a few millimeters of the optically active surface, wherein the substrate is closed at the back by a separate cover plate and a frictionally engaging closure of the channels in the substrate is achieved.

FIG. 4 shows another preferred realization in which finely structured channels 13 with a substantially rectangular cross section are cut in up to the immediate vicinity (<10 mm) of the optically active substrate 11. A cover 16 is connected to the substrate 11 by way of the cut channels 13 so as to be tight against pressure (with respect to the heat transport medium 4) by means of a plurality of screws. The cover 16 need not be made from the same material as the actual substrate 11; it need only have a similar thermal expansion coefficient.

The holders 18 shown in dashed lines in FIG. 4 illustrate a possible alternative for the frictional engagement of the substrate 11 and cover 16. Other connection possibilities include, e.g., gluing, cementing or soldering. The construction of the channels 13, shown in FIG. 4, in symmetrical curved shapes is only one of many possibilities for a channel system which is, as far as possible, radially symmetrical and uniformly distributed around a circle.

All of the preceding drawings refer to standard directly reflecting collector mirrors 1 for applying in LPP sources. With gas discharge sources (GDPP sources), metal substrates 51 or metallic coatings are regularly used as collectors 5 for grazing light incidence. In these cases, the reflection layers 52 are appreciably more stable with respect to temperature. However, substrate-integrated temperature management can also lead to an increased lifetime or to a stabilization of the optical characteristics at high thermal loading for a collector 5 of this type.

Figure 5:
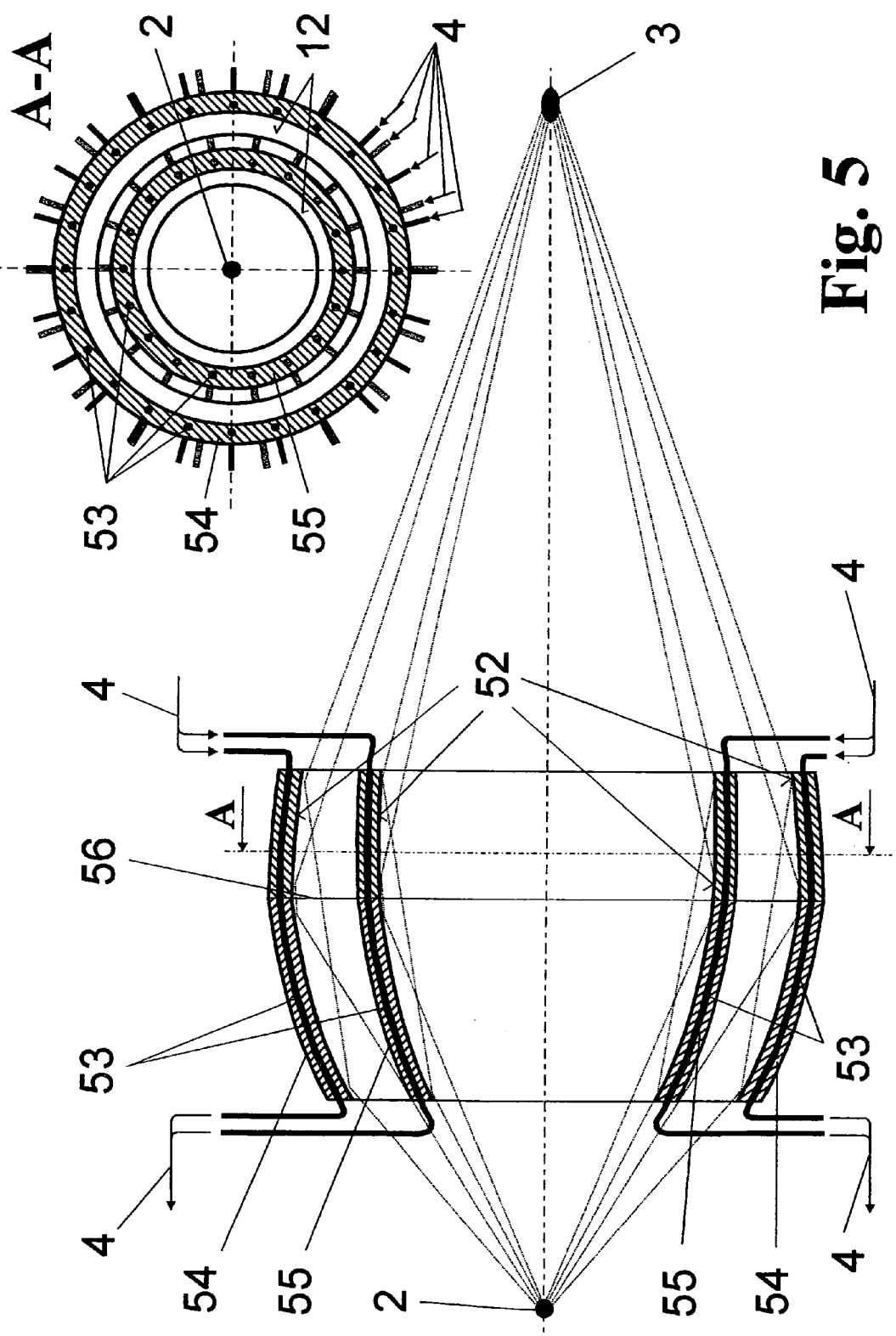
FIG. 5 is a schematic view of a collector mirror for a GDPP source in which a plurality of mirror shells having a metal substrate with corresponding flow channels for the heat transport medium are arranged for a grazing radiation reflection.

As is indicated in FIG. 5, channels 53 are introduced close to the surface in a rotationally symmetric substrate 51 which comprises ellipsoidal and hyperbolic or parabolic outside surfaces and which, therefore, has a bend plane 56.

With grazing radiation incidence, the collector 5 preferably comprises two or more mirror surfaces 54, 55 (only two are shown in FIG. 5) which are nested one inside the other concentrically, each of which represents individual substrates 51 with channels 53. The channels 53 are introduced in the same way as with the silicon substrate 11 described above and make it possible for the heat transport medium 4 to flow through the substrate 51 in a uniformly distributed manner. The channels 53 are preferably generated through epitaxial or lithographic methods.

The substrates 51 of the (multiple-part) collector 5 have a very good thermal conductivity (>100 W/mK), e.g., through the use of a metal such as molybdenum, tungsten or copper, and are provided with a reflection coating 52 (comprising vacuum-deposited palladium, for example) for achieving a reflectivity of more than 50% (with grazing incidence of radiation in the wavelength range around 13.5 nm).

While the foregoing description and drawings represent the present invention, it will be obvious to those skilled in the art that various changes may be made therein without departing from the true spirit and scope of the present invention.

REFERENCE NUMBERS

| | |
|---|---|
| 1 | collector mirror |
| 11 | substrate |
| 13 | channels |
| 14 | threaded bore hole |
| 15 | screws |
| 16 | cover (channel covering) |
| 17 | cooling body |
| 18 | holder |
| 19 | heat-conducting layer |
| 2 | plasma |
| 3 | intermediate focus |
| 4 | heat transport medium |
| 5 | collector |
| 51 | substrate |
| 52 | reflection coating |
| 53 | channels |
| 54, 55 | mirror surfaces |
| 56 | bend plane (of the mirror shells) |
| $t_m$ | tangent |

What is claimed is:

1. A collector mirror for short-wavelength radiation sources based on a plasma, comprising:
an optically active mirror surface with high reflectivity for desired short-wavelength radiation;
means for managing the temperature of the mirror body being provided due to the position of the collector mirror in the immediate vicinity of the plasma which has an extremely high temperature;
said collector mirror having a solid, rotationally symmetric substrate which comprises a material with high thermal conductivity of more than 50 W/mK; and
channels for cooling and temperature management being incorporated in the substrate so that a heat transport medium can flow through directly for rapidly stabilizing the temperature of the optically active mirror surface at a defined level, wherein heat of transient temperature spikes which occur in pulsed operation for plasma generation and which temporarily exceed the temperature average prevailing at the mirror surface by a multiple is quickly dissipated.

2. The arrangement according to claim 1, wherein the channels for the heat transport medium are arranged close to the optically active mirror surface and have at least predominantly a radial flow direction within the substrate.

3. The arrangement according to claim 2, wherein the channels are arranged so as to be uniformly distributed in radial direction to the optical axis of the collector mirror, wherein connections for supplying and discharging the heat transport medium are provided in the center and at the periphery of the substrate.

4. The arrangement according to claim 3, wherein the channels are arranged orthogonal to the axis of symmetry of the substrate.

5. The arrangement according to claim 3, wherein the channels are arranged parallel to a middle tangent ($t_m$) at the generating curve of the optically active mirror surface along an outer surface of a cone.

6. The arrangement according to claim 3, wherein the channels for the heat transport medium are constructed in the form of cylindrical bore holes.

7. The arrangement according to claim 6, wherein the connections for supplying the heat transport medium are screwed into threaded bore holes in the substrate.

8. The arrangement according to claim 2, wherein the channels are introduced in the substrate in the form of finely structured channels for a substantially radial flow of the heat transport medium from the back of the collector mirror, wherein the channels extend up to the optically active mirror surface at a constant distance of less than 10 mm.

9. The arrangement according to claim 8, wherein the channels are constructed in a plurality of curved structures which are arranged so as to be uniformly distributed around the axis of symmetry of the substrate.

10. The arrangement according to claim 8, wherein the substrate is constructed in two parts, wherein the first part, as substrate, has the optically active mirror surface and the finely structured channels incorporated on the back, and the second part, as cover, is designed to cover the channels so as to be tight against media.

11. The arrangement according to claim 10, wherein in order to connect the substrate and cover in such a way that the channels are sealed off, machining is carried out such that the two surfaces which lie one on top of the other are in a positive engagement with one another and are locked in a frictional engagement.

12. The arrangement according to claim 10, wherein a structured seal is provided between the substrate and cover in order to connect these two parts in such a way that the channels are sealed.

13. The arrangement according to claim 10, wherein the cover is pressed against the substrate by screws through a plurality of threaded bore holes in the substrate.

14. The arrangement according to claim 10, wherein the cover is pressed against the substrate by clamps arranged at the periphery.

15. The arrangement according to claim 10, wherein the cover is connected to the substrate by a material bond.

16. The arrangement according to claim 15, wherein the cover is connected to the substrate by cementing.

17. The arrangement according to claim 15, wherein the cover is connected to the substrate by a solder connection.

18. The arrangement according to claim 1, wherein, with non-grazing incidence of the desired radiation, the substrate is fashioned in aspherical shape from a material with a thermal conductivity of more than 100 W/mK and the optically active mirror surface is provided with a reflection coating which has a reflectivity of more than 40% in the wavelength region around 13.5 nm.

19. The arrangement according to claim 18, wherein the substrate is made of silicon and the reflection coating is made as an alternating-layer system including silicon.

20. The arrangement according to claim 18, wherein the alternating-layer system is formed of alternating-layers of Si and molybdenum.

21. The arrangement according to claim 1, wherein, in case of grazing incidence of the desired radiation, the substrate is made from a metal with a thermal conductivity of 50 W/mK and, at the same time, with a high reflectivity for a directly integrated mirror surface having a reflectivity of greater than 50% with grazing radiation incidence in the wavelength range around 13.5 nm.

22. The arrangement according to claim 21, wherein the substrate for a directly integrated mirror surface is made from palladium, ruthenium or gold.

23. The arrangement according to claim 1, wherein, in case of grazing incidence of the desired radiation, the substrate is made form a metal with a thermal conductivity of more than 100 W/mK and the optically active mirror surface is provided with a reflection coating which has a reflectivity of greater than 50% with grazing radiation incidence in the wavelength range of 13.5 nm.

24. The arrangement according to claim 21, wherein the substrate is provided with a surface-coating layer at the optically active surface.

25. The arrangement according to claim 23, wherein the reflection coating is made from palladium or ruthenium.

* * * * *